US012803576B2

(12) United States Patent
Ishimoto et al.

(10) Patent No.: US 12,803,576 B2
(45) Date of Patent: Nov. 17, 2026

(54) WEIGHTING INFORMATION GENERATING APPARATUS AND ANALOG-TO-DIGITAL CONVERSION APPARATUS

(71) Applicant: Magnescale Co., Ltd., Kanagawa (JP)

(72) Inventors: Shigeru Ishimoto, Kanagawa (JP); Tsutomu Enomoto, Kanagawa (JP); Hajime Ohtsubo, Kanagawa (JP)

(73) Assignee: Magnescale Co., Ltd., Kanagawa (JP)

( * ) Notice: Subject to any disclaimer, the term of this patent is extended or adjusted under 35 U.S.C. 154(b) by 88 days.

(21) Appl. No.: 19/065,600

(22) Filed: Feb. 27, 2025

(65) Prior Publication Data

US 2025/0279787 A1 Sep. 4, 2025

(30) Foreign Application Priority Data

Feb. 29, 2024 (JP) ................................. 2024-029399

(51) Int. Cl.
*H03M 1/10* (2006.01)
*H03M 1/80* (2006.01)

(52) U.S. Cl.
CPC .................................. *H03M 1/804* (2013.01)

(58) Field of Classification Search
CPC ............. H03M 1/1047; H03M 1/0602; H03M 1/1004; H03M 1/1038; H03M 1/38; H03M 1/46; H03M 1/462; H03M 1/785; H03M 1/002; H03M 1/069; H03M 1/1014; H03M 1/1028; H03M 1/1052; H03M 1/1057; H03M 1/12; H03M 1/18; H03M 1/403; H03M 1/68; H03M 1/687; H03M 1/00; H03M 1/0604; H03M 1/0617; H03M 1/0624; H03M 1/0639; H03M 1/066;

(Continued)

(56) References Cited

U.S. PATENT DOCUMENTS

2004/0227652 A1* 11/2004 Draxelmayr ........ H03M 1/1033 341/172
2007/0075884 A1* 4/2007 Melanson ........... H03M 1/1038 341/120
2011/0122006 A1* 5/2011 Liao .................... H03M 1/1047 341/120
2013/0127647 A1* 5/2013 Huang ................ H03M 1/1061 341/110
2013/0162454 A1* 6/2013 Lin ....................... H03M 1/125 341/161

(Continued)

FOREIGN PATENT DOCUMENTS

JP H11-074789 A 3/1999

*Primary Examiner* — Linh V Nguyen
(74) *Attorney, Agent, or Firm* — IP Business Solutions, LLC.

(57) ABSTRACT

[Problems] To provide a weighting information generating apparatus capable of generating weighting information for improving integral nonlinearity without using a high precision digital-to-analog converter.
[Solution to the Problem] The weighting information generating apparatus 20 includes: a voltage input unit 21, 22, 23, 24*a* that has a voltage generation unit 21, 22 configured to generate predetermined binary voltages; and a voltage offset unit 21, 23 configured to apply a voltage for offset to the binary voltages generated by the voltage generation unit 21, 22 to offset the binary voltages, and is configured to sequentially input the offset binary voltages, which are offset stepwise for each predetermined voltage, into an analog-to-digital converter 10; and an information generating unit 21 that is configured to acquire output values corresponding to the binary voltages output from the analog-to-digital converter 10, and generate weighting information based on the acquired output values.

7 Claims, 15 Drawing Sheets

(58) Field of Classification Search
CPC ............. H03M 1/0665; H03M 1/0678; H03M 1/0682; H03M 1/0697; H03M 1/08; H03M 1/1023; H03M 1/1042; H03M 1/1071; H03M 1/1245; H03M 1/125; H03M 1/1285; H03M 1/129; H03M 1/181; H03M 1/40; H03M 1/52; H03M 1/745; H03M 3/30; H03M 3/368; H03M 3/388; H03M 3/422; H03M 3/454; H03M 3/458; H03M 3/46; H03M 3/50; H03M 7/165
USPC ................. 341/118–120, 155, 161, 162, 172
See application file for complete search history.

(56) References Cited

U.S. PATENT DOCUMENTS

| | | | | | |
|---|---|---|---|---|---|
| 2014/0167988 | A1* | 6/2014 | Hong | H03M 1/1061 | 341/110 |
| 2014/0184432 | A1* | 7/2014 | Huang | H03M 1/1057 | 341/110 |
| 2015/0002325 | A1* | 1/2015 | Lin | H03M 3/368 | 341/143 |
| 2015/0146066 | A1* | 5/2015 | Gou | H03M 1/18 | 348/308 |
| 2017/0012639 | A1* | 1/2017 | Bogner | H03M 1/468 | |
| 2021/0218409 | A1* | 7/2021 | Ho | H03M 1/804 | |
| 2021/0313997 | A1* | 10/2021 | Alpman | H03M 1/0665 | |

* cited by examiner (a)

(b)

(c)

(a)

(b)

(a)

(b)

(C)

WEIGHTING INFORMATION GENERATING APPARATUS AND ANALOG-TO-DIGITAL CONVERSION APPARATUS

TECHNICAL FIELD

The present invention relates to an analog-to-digital converter including a weighting adjustment unit configured to correct a conversion accuracy, and in particular, to a weighting information generating apparatus that generates weighting information to be applied to the weighting adjustment unit, and to an analog-to-digital conversion apparatus including the weighting information generating apparatus and the analog-to-digital converter.

BACKGROUND ART

Traditional analog-to-digital converters (ADCs) require linearity as a correlation between input and output values in terms of their conversion accuracy, and linearity is generally viewed in terms of both differential nonlinearity (DNL) and integral nonlinearity (INL). Here, the differential nonlinearity represents a deviation from the ideal value per code, and integral nonlinearity represents the integrated value of differential nonlinearity. In particular, the integral nonlinearity represents overall linearity, and in cases where the analog-to-digital converter exhibits gain error or offset error, the integral nonlinearity often includes inflection points that change in a stepwise manner.

In view of the background, a measurement device that measures integral nonlinearity has been proposed in order to enhance the accuracy of analog-to-digital converters (see Patent Document 1 below). In the measurement device, an analog-to-digital converter or a digital-to-analog converter (DAC) with higher precision than the target analog-to-digital converter is used to generate a known voltage. This known voltage is input to the target analog-to-digital converter to calculate differential nonlinearity (DNL), and integral nonlinearity is then calculated by changing the voltage value of the digital-to-analog converter and repeating the process multiple times.

The integral nonlinearity calculated in this way is stored as correction data for the analog-to-digital converter. By applying the obtained correction data to the analog-to-digital converter during the analog-to-digital conversion process, it is possible to obtain an output having good corrected linearity.

PRIOR ART DOCUMENTS

Patent Documents

[Patent Document 1] Japanese Unexamined Patent Publication No. 11-74789

SUMMARY OF THE INVENTION

Problem to be Solved

However, the traditional measurement devices require a digital-to-analog converter with higher resolution and higher precision than the analog-to-digital converter to be measured, which results in an increase in manufacturing cost. Additionally, it is necessary to maintain the precision of the digital-to-analog converter. Therefore, it has also been necessary to establish correction techniques to guarantee the precision of the digital-to-analog converter.

The present invention has been developed in consideration of the above circumstances and it is an object of the present invention to provide a weighting information generating apparatus capable of generating weighting information to improve the integral nonlinearity of an analog-to-digital converter, without using a high-precision and expensive digital-to-analog converter, and to provide an analog-to-digital conversion apparatus including the weighting information generating apparatus and the analog-to-digital converter.

Solution to Problem

The present invention to solve the above problem is, a weighting information generating apparatus configured to generate weighting information to be applied to a weighting adjustment unit of an analog-to-digital converter provided with the weighting adjustment unit, comprising:

a voltage input unit having a voltage generation unit that generates a predetermined voltage (binary voltage), and a voltage offset unit that offsets the binary voltage generated by the voltage generation unit by applying a voltage for offset, and configured to sequentially input offset binary voltages stepwise offset for each predetermined voltage to the analog-to-digital converter; and an information generating unit that acquires output values corresponding to the binary voltages output from the analog-to-digital converter, and generates the weighting information based on the acquired output values.

According to the weighting information generating apparatus, the voltage input unit generates stepwise offset binary voltages (offset binary voltages) for each predetermined voltage, and the generated offset binary voltages are sequentially input to the analog-to-digital converter. Then, output values corresponding to the offset binary voltages output from the analog-to-digital converter are acquired by the information generating unit, and weighting information is generated based on the acquired output values.

According to the findings of the present inventors, the integral nonlinearity of an analog-to-digital converter often exhibits an inflection point near a voltage corresponding to the capacitance of a constituent capacitor, for example, particularly in the case of a successive approximation type analog-to-digital converter. This is because the integral nonlinearity is affected by the capacitance error of the capacitor formed.

Therefore, by inputting offset binary voltages including a voltage corresponding to the capacitance of a constituent capacitor into the analog-to-digital converter and verifying the output values, it is possible to determine whether an inflection point exists in a graph representing the integral nonlinearity, or in other words, whether the integral nonlinearity is sufficient.

If an inflection point appears in the integral nonlinearity, weighting information that enables improvement of the integral nonlinearity is generated, based on the relationship between the input and output values, by adjusting the weighting adjustment unit using a theoretical or empirical method.

Thus, according to the weighting information generating apparatus of the present invention, by generating offset binary voltages that are stepwise offset for each predetermined voltage and inputting the offset binary voltages to an analog-to-digital converter, the integral nonlinearity of the analog-to-digital converter can be verified, and weighting information to improve the integral nonlinearity can be generated.

Therefore, it is possible to verify and improve the integral nonlinearity of analog-to-digital converters with an inexpensive configuration compared to the traditional method of using a high precision and expensive digital-to-analog converter.

The information generating unit may be configured to generate weighting information such that the output values output from the analog-to-digital converter exhibit the same phase and fall within a predetermined reference range.

Further, the voltage input unit may be configured to generate a plurality of binary voltages as offset voltages such that at least one of the plurality of binary voltages has voltages corresponding to ⅛, ¼, ⅜, ½, ⅝, ¾, and ⅞ of the full scale of the analog-to-digital converter, and to input the same to the analog-to-digital converter.

Further, the voltage input unit may be configured to generate a plurality of binary voltages as offset voltages such that at least one of the plurality of binary voltages has a voltage corresponding to $2^n-(1/2)^m$ of the full scale of the analog-to-digital conversion apparatus, and to input the same to the analog-to-digital converter.

Where, m is the number of bits representing the resolution of the analog-to-digital converter; and n is an integer satisfying the following $$n<2^{m/2}.$$

Additionally, the voltage input unit may be configured to sequentially input binary voltages that are offset by the same offset interval to the analog-to-digital converter.

The information generating unit may be configured to acquire output values corresponding to each of the binary voltage voltages output from the analog-to-digital converter, compare an acquired output value with other output values, and when a difference value exceeds a predetermined reference range or when the sign of the difference value is reversed, store the corresponding input binary voltage, and adjust the weighting adjustment unit of the analog-to-digital converter, while the stored input binary voltage is input from the voltage input unit to the analog-to-digital converter, such that the difference between the output value and the other output values falls within the reference range and the signs are the same, and generate the state of the weighting adjustment unit at that time, as weighting information.

The present invention relates to an analog-to-digital conversion apparatus including any of the above mentioned weighting information generating apparatus and an analog-to-digital converter connected to the weighting information generating apparatus.

Advantageous Effect of the Invention

According to the weighting information generating apparatus of the present invention, by generating offset binary voltages that are stepwise offset for each predetermined voltage and inputting the offset binary voltages to an analog-to-digital converter, the integral nonlinearity of the analog-to-digital converter can be verified, and weighting information to improve the integral nonlinearity can be generated. Therefore, it is possible to verify and improve the integral nonlinearity of analog-to-digital converters with an inexpensive configuration compared to the traditional method of using a high precision and expensive digital-to-analog converter.

DETAILED DESCRIPTION

Figure 1:
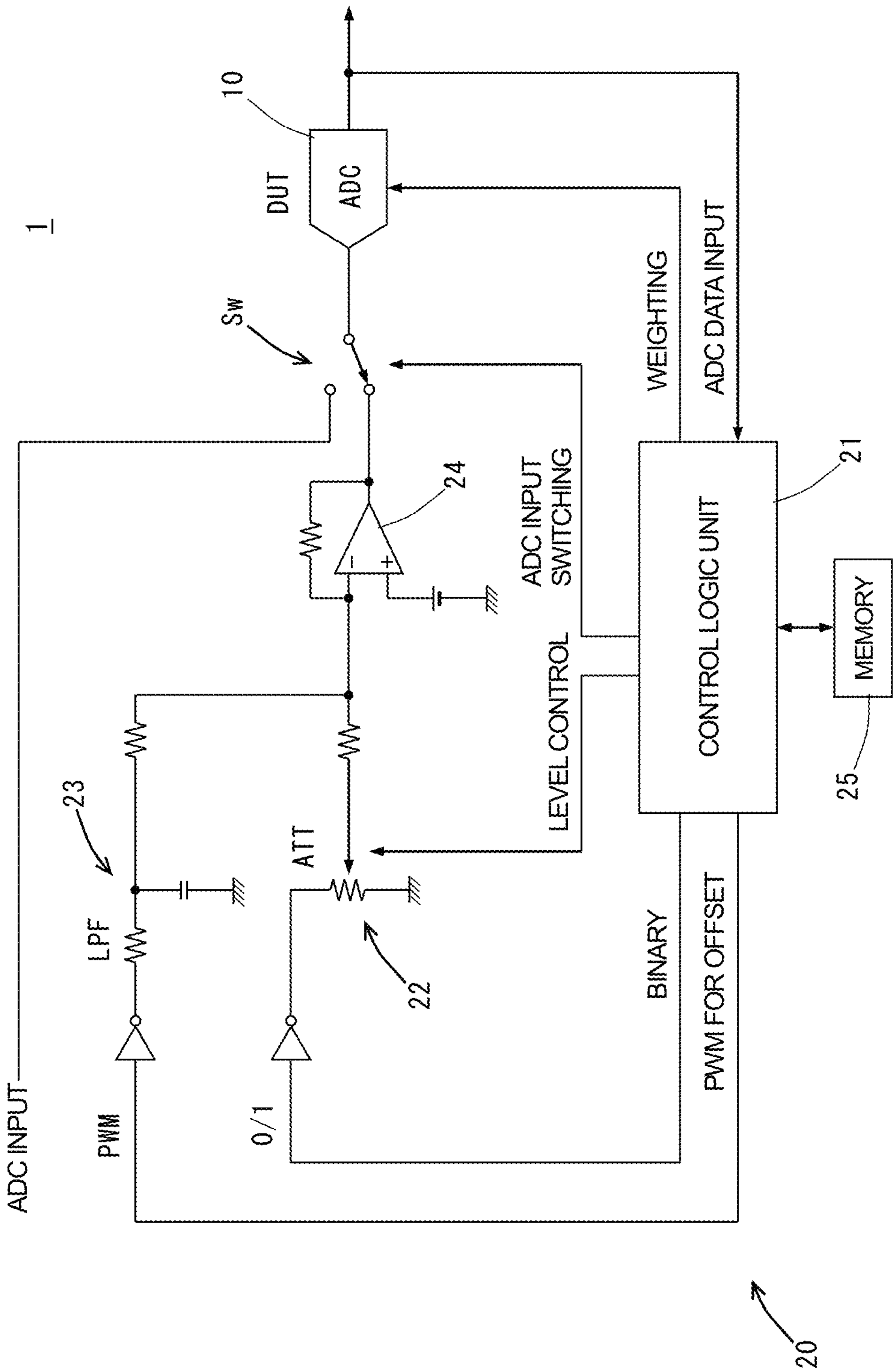
FIG. 1 is a circuit diagram illustrating a schematic configuration of an analog-to-digital conversion apparatus according to an embodiment of the present invention.

Particular embodiments of the present invention will be described below with reference to the drawings. As illustrated in FIG. 1, an analog-to-digital conversion apparatus 1 according to the present example includes an analog-to-digital converter 10 and a weighting information generating unit 20.

<Analog-to-Digital Converter>

Figure 2:
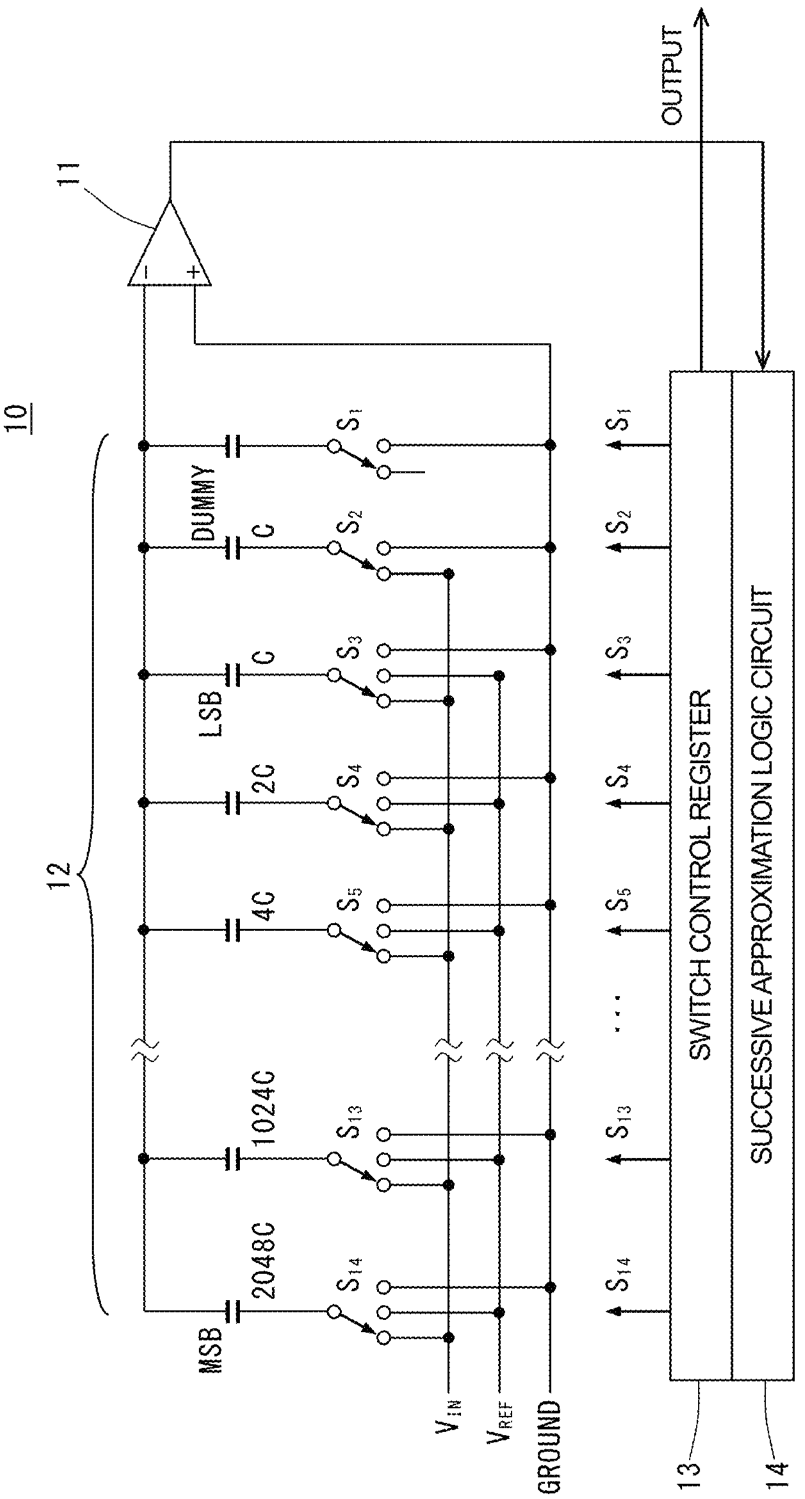
FIG. 2 is a circuit diagram illustrating a schematic configuration of an analog-to-digital converter according to the present embodiment.

A schematic configuration of the analog-to-digital converter 10 in the present example is illustrated in FIG. 2. The analog-to-digital converter 10 is of the so-called successive approximation type and is configured using a weighted capacitor array. In the present example, an analog-to-digital converter with a resolution of 12 bits is illustrated. Reference character 11 denotes a comparator, reference character 12 denotes a capacitor array unit, reference character 13 denotes a switch control register, and reference character 14 denotes a successive approximation logic circuit. The capacitor array unit 12 includes a circuit (a capacitive digital/analog conversion circuit) that inherently has a sample-and-hold function for holding an input voltage, and a digital/analog conversion function for generating a comparison voltage. The capacitor array unit 12 is based on the principle of charge redistribution to generate an analog voltage, and includes a capacitor array composed of a plurality of capacitors (13 capacitors in this example) used for binary weighting and a dummy capacitor having the same capacitance as the capacitor corresponding to the least significant bit 1 ($2^0$) (LSB). The capacitor array unit 12 further includes switches $S_1$ to $S_{14}$ that switch the connections of the capacitor array.

Assuming that the capacitor corresponding to the 1st bit ($2^0$), which is the least significant bit (LSB), of the capacitor array has a reference capacitance C, the capacitor corresponding to the 2nd bit ($2^1$) has a capacitance of 2C (i.e., 2LSB), the capacitor corresponding to the 3rd bit ($2^2$) has a capacitance of 4C (i.e., 4LSB), and so on. In this manner, the capacitor corresponding to the 12th bit ($2^{11}$), which is the most significant bit (MSB), is set to have a capacitance of 2048C (i.e., 2048LSB). However, the resolution is not limited to 12 bits, and resolutions of appropriate values can be used as needed.

The switch control register 13 is a control unit that switches the connections of the switches $S_1$ to $S_{14}$ provided in the capacitor array unit 12 based on the processing results of the successive approximation logic circuit 14. The successive approximation logic circuit 14 is a logic circuit that performs search processing according to a binary search algorithm based on the output of the comparator 11.

In the analog-to-digital converter 10, first, each of the switch $S_1$ to $S_{14}$ of the capacitor array unit 12 is connected to the GROUND side to be grounded, discharging the charge of each capacitor to 0. Next, while keeping the switch $S_1$ connected to the GROUND side, the switches $S_2$ to $S_{14}$ are connected to the input side $V_{IN}$, applying the input voltage $V_{IN}$ to each capacitor to charge them. The switch $S_1$ is then disconnected from the GROUND side, and the switches $S_2$ to $S_{14}$ are connected to the GROUND side. As a result, the potential of each capacitor connected to the negative side of the comparator 11 becomes $-V_{IN}$. Next, in accordance with the search processing of the successive approximation logic circuit 14 based on the output of the comparator 11, the switch $S_{14}$ corresponding to the most significant bit and sequentially the switches $S_{13}$ to $S_3$ corresponding to the lower bits are appropriately connected to the reference side $V_{REF}$. The reference voltage $V_{REF}$ is sequentially applied to the capacitors corresponding to the higher bits according to the binary search algorithm. In each connection state, the input voltage $V_{IN}$ and the reference voltage $V_{REF}$ are compared by the comparator 11, and when the input voltage $V_{IN}$ becomes equal to the reference voltage $V_{REF}$, a digital signal of the input voltage is output from the switch control register 13.

In a position detection device (encoder) using two or more periodic signals with different phases, the resolution of the encoder is improved by changing the ratio in which two signals are added to generate a plurality of phase signals, converting these signals into binary values, and adding them together. As a result, a resolution that is several tens of times higher than the cycle of the original periodic signals can be achieved.

Recently, further improvements in resolution have been made, and a method is becoming mainstream in which a plurality of periodic signals are converted into digital values using analog-to-digital converters. The phase angle is then calculated using an arctangent function based on the ratio of the amplitude values of the periodic signals. By accumulating the differences in this phase angle between samples, a resolution that is several hundred times greater than the cycle of the original periodic signals can be achieved, enabling highly accurate position detection. However, when the integral nonlinearity error (INL) of the analog-to-digital converter is large, distortion occurs in the periodic signal obtained from the analog-to-digital converter, which results in a deterioration in the segmentation accuracy within one cycle of the periodic signal.

The cause of integral nonlinearity error differs depending on the configuration of the analog-to-digital converter. In the successive approximation type analog-to-digital converter of the present example, as described above, the capacitor array unit 12 is configured such that the capacitor capacitance increases in powers of 2: 1C, 2C, 4C, . . . 1024C, and 2048C. Therefore, when the capacitance of the capacitors formed as the devices of the electronic circuits increases, the capacitance accuracy of the formed capacitors will have a much larger error than the capacitance accuracy of the capacitors with the smallest capacitance. It is difficult to increase the accuracy of the integral nonlinearity in the case of high resolution analog-to-digital converters.

Figure 3:
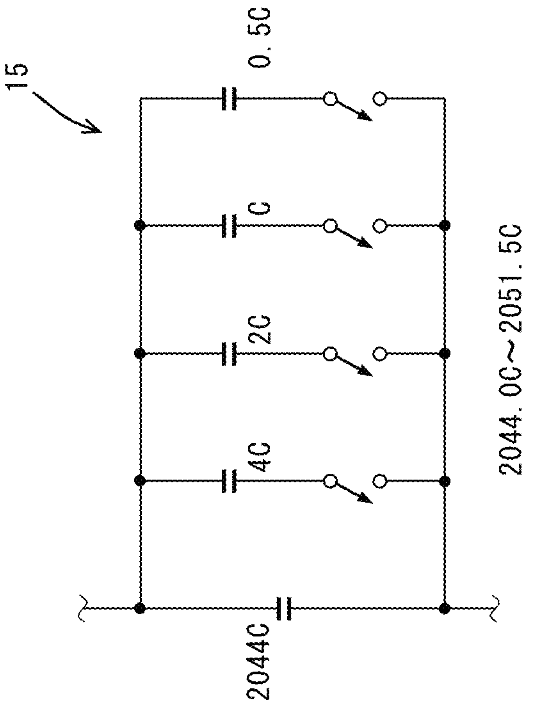
FIG. 3 is a circuit diagram illustrating a schematic configuration of an weighting adjustment unit according to the present embodiment.

Traditionally, as illustrated in FIG. 3, each capacitor unit (capacitor) in the capacitor array unit 12 was provided with a weighting adjustment unit 15 for capacitance correction, and by appropriately setting correction capacitors provided in the weighting adjustment unit 15 based on the measurement results of the integral nonlinearity error (INL) of the analog-to-digital converter 10, the integral nonlinearity of the analog-to-digital converter 10 was improved so as to have ideal linearity.

Further, the weighting adjustment unit 15 illustrated in FIG. 3 has a capacitor having a capacitance of 0.5C, C, 2C, and 4C in parallel with a capacitor having a capacitance of 2044C, and by selectively enabling these capacitors, the capacitor capacitance of the capacitor array unit 12 can be corrected (adjusted) in the range of 2044.0C to 2051.5C. The weighting adjustment unit 15 is provided on a capacitor having a large capacitance that is more likely to produce significant errors. For example, in the capacitor array unit 12 illustrated in FIG. 2, the weighting adjustment unit 15 is provided on capacitors corresponding to 1024C (=1024LSB), 2048C (=2048LSB), 512C (=512LSB), or the like. However, the weighting adjustment unit 15 is not limited to this.

As described above, the measurement of integral nonlinearity requires a highly accurate voltage generation means, such as a digital-to-analog converter (DAC). To precisely set the voltage by using the high precision digital-to-analog converter and repeatedly capture the output values from the said digital-to-analog converter, it was difficult to realize this due to factors such as cost. Therefore, the present embodiment provides a weighting information generating apparatus 20 that generates weighting information for correcting integral nonlinearity without using a high precision digital/analog converter, instead, using inexpensive means and under conditions that significantly reduce the number of measurement points, and an analog-to-digital conversion apparatus 1 including the weighting information generating unit 20 and the analog-to-digital converter 10.

<Premise Considerations for Generating Weighting Information>

As described above, in the successive approximation type analog-to-digital converter 10 illustrated in the present example, each capacitor of the capacitor array unit 12 is set to have a capacitance of an n-th power of two. In the 12-bit case of this example, the capacitance of the capacitor corresponding to LSB and that of the capacitor corresponding to MSB are 2048 times different.

The capacitance setting error in each capacitor appears as integral nonlinearity, and if there is an error in the capacitance of the capacitor corresponding to the most significant bit, for example, an inflection point appears approximately 2048LSB, which is the full scale, and if there is an error in the capacitance of the capacitor corresponding to the bit below that, inflection points appear approximately every 1024LSB. Likewise, if there is an error in the capacitor corresponding to the bit below that, inflection points appear approximately every 512LSB. Here, LSB is a quantization unit, which means the voltage corresponding to the least significant bit.

The capacitor corresponding to the LSB with the smallest capacitance also has a smaller percentage of error compared to other capacitors, and this capacitance error has a smaller impact on the integral nonlinearity. On the other hand, in the case of a capacitor with a large capacitance, its capacitance error has a large impact on the integral nonlinearity. Therefore, the integral nonlinearity can be improved by detecting the inflection point of the integral nonlinearity for the part corresponding to the somewhat larger LSB, and correcting the capacitance according to the value of the inflection point.

Here, the relationship between the input voltage and the output voltage is discussed with respect to several aspects of integral nonlinearity without inflection points and integral nonlinearity with inflection points.

Figure 4:
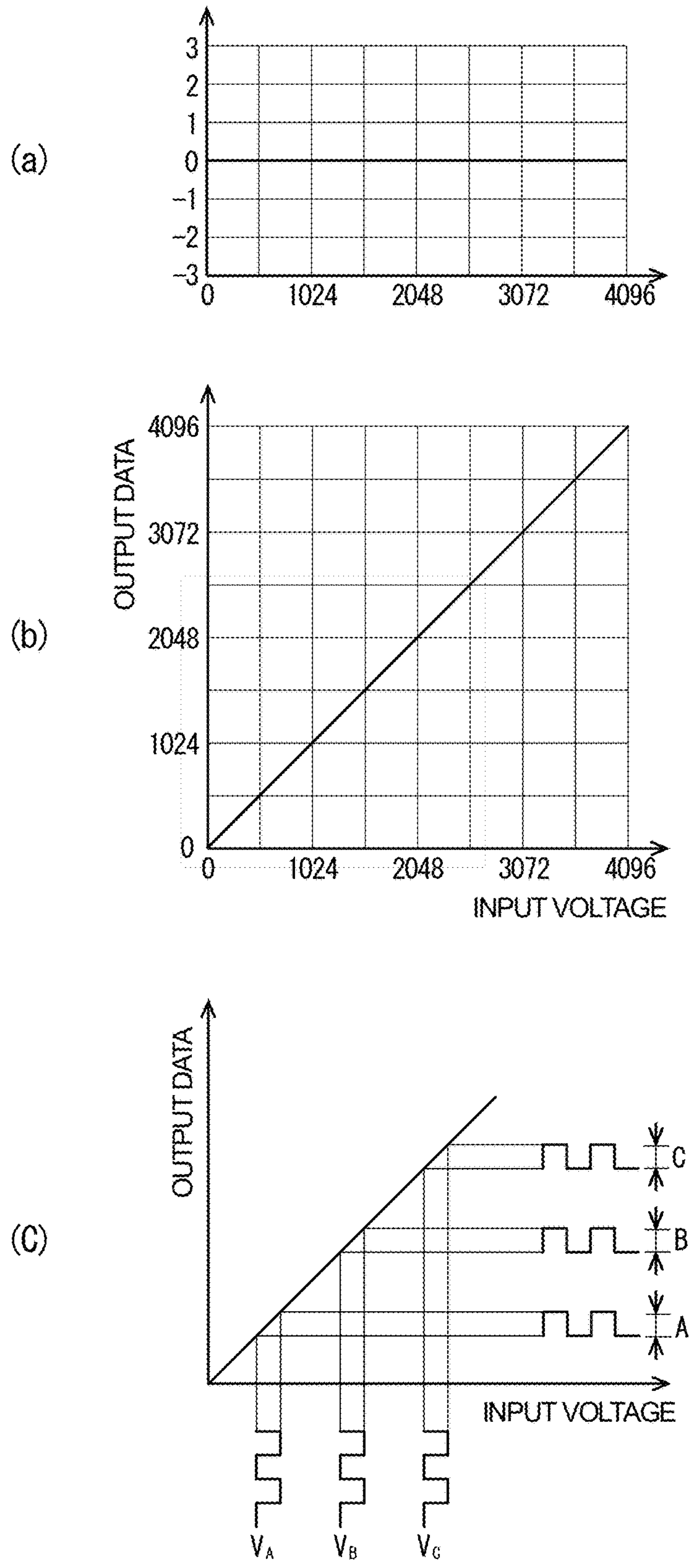
FIG. 4 is an explanatory diagram illustrating a weighting information generation process.

First, as illustrated in FIG. 4(*a*), in the ideal case where the integral nonlinearity (INL) has no inflection points, that is, if INL<1, the relationship between the input analog voltage and the output data becomes a straight line as illustrated in FIG. 4(*b*). Then, an arbitrary binary voltage, that is, a pulse shaped voltage forming a rectangular waveform is generated. To this binary voltage serving as the reference, a voltage for offset is applied to generate a set of binary voltages (offset binary voltages) that are offset stepwise and at equal intervals for each predetermined voltage. These offset binary voltages are then input to the analog-to-digital converter 10 having the characteristics described above. FIG. 4(C) illustrates a relationship between the input offset binary voltage and the output data from the analog-to-digital converter 10. That is, in FIG. 4(C), three offset binary voltages $V_A$, $V_B$, and $V_C$ of different magnitudes that are offset at equal intervals in three steps are input to the analog-to-digital converter 10. The respective differences A, B, and C in the corresponding three output data values are equal, that is, A=B=C.

Figure 5:
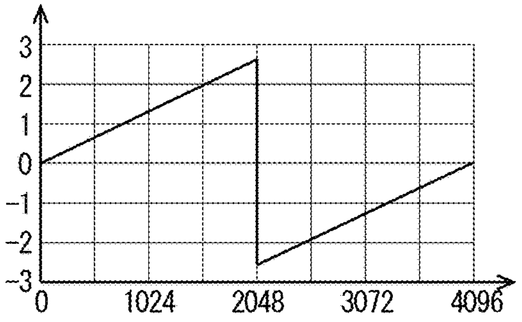
FIG. 5 is an explanatory diagram illustrating the weighting information generation process.
Figure 5:
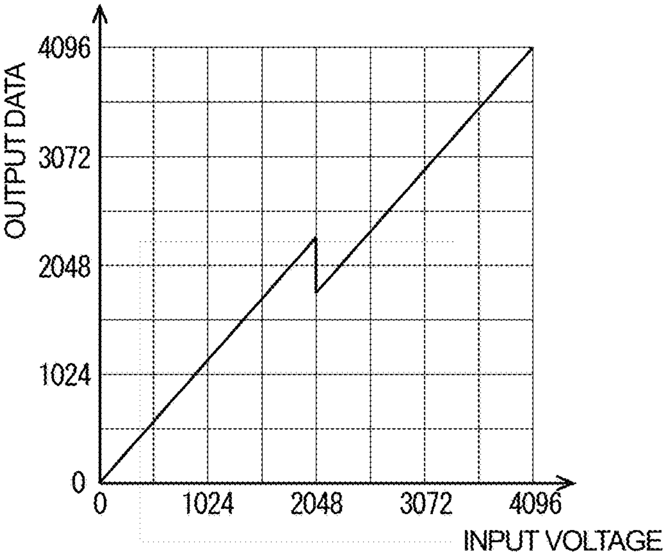
Figure 5:
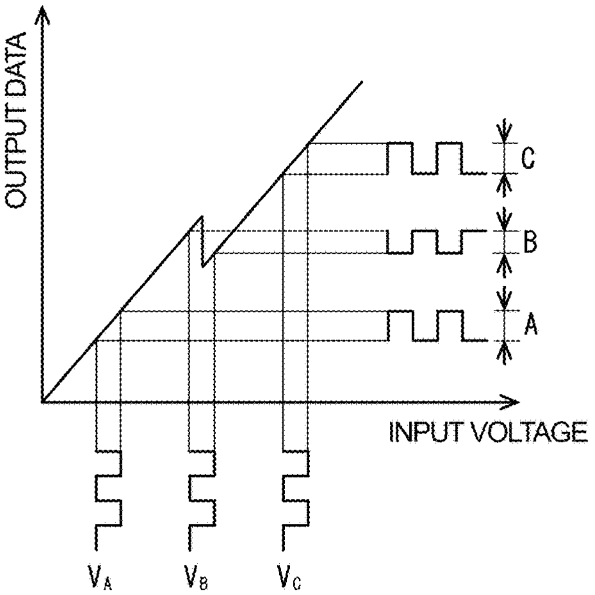

Next, in a case where the integral nonlinearity exhibits a "sawtooth-like shape" with a rising slope as illustrated in FIG. 5(*a*), in other words, when the integral nonlinearity abruptly changes in the negative direction, the relationship between the input analog voltage and the output data is as illustrated in the diagram of FIG. 5(*b*). It should be noted that FIG. 5(*a*) illustrates the integral nonlinearity in a case where the capacitor corresponding to the full scale 2048LSB has a capacitance error that is larger than the setting. As illustrated in FIG. 5(*a*), the integral nonlinearity has an inflection point at the point where the input voltage corresponds to 2048LSB. Similarly, in the diagram illustrating the relationship between the input voltage and the output data, an inflection point appears at the point where the input voltage corresponds to 2048LSB (FIG. 5(*b*)).

When several (e.g., three) offset binary voltages are input to an analog-to-digital converter 10 with such characteristics, as described above, the relationship between the input analog voltage and the output data is as illustrated in FIG. 5(C). That is, in FIG. 5(C), three offset binary voltages $V_A$, $V_B$, and $V_C$ offset at equal intervals are input to the analog-to-digital converter 10. When the voltage $V_B$ of the middle magnitude is set to the voltage corresponding to 2048LSB (the voltage corresponding to the inflection point), the output data corresponding to the voltages $V_A$, $V_C$ before and after this inflection point are in the same phase, and their differences A and C are the same value. That is, A=C. On the other hand, the output data corresponding to the voltage $V_B$ to the inflection point is inverted in phase with the output data before and after the voltage $V_B$, and its difference B is different in value from the differences A and C before and after, which is a smaller value. That is, A=C>B.

Figure 6:
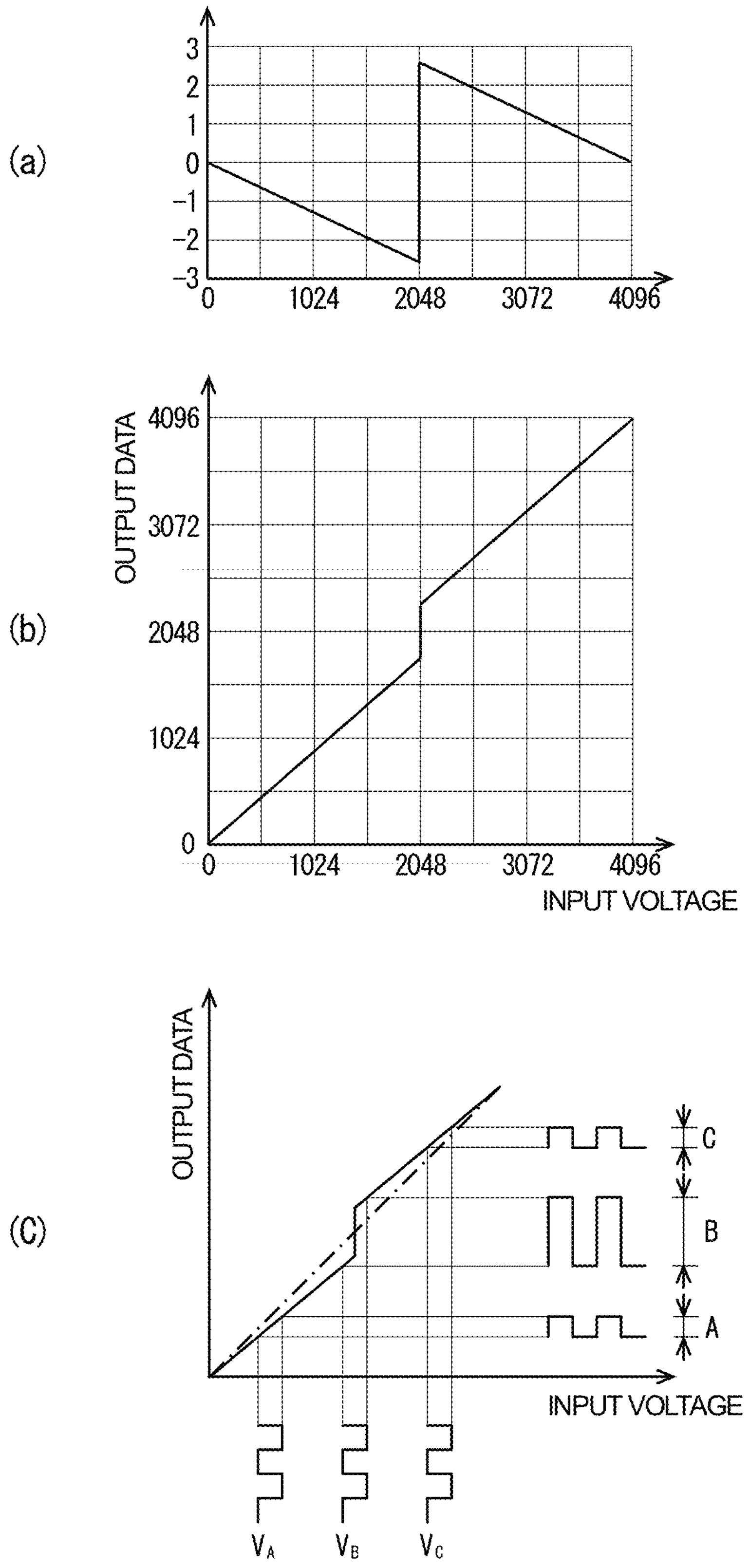
FIG. 6 is an explanatory diagram illustrating the weighting information generation process.

Next, in a case where the integral nonlinearity exhibits a "sawtooth-like shape" with a downward slope as illustrated in FIG. 6(*a*), in other words, when the integral nonlinearity abruptly changes in the positive direction, the relationship between the input analog voltage and the output data is as illustrated in the diagram of FIG. 6(*b*). It should be noted that FIG. 6(*a*) illustrates the integral nonlinearity in a case where the capacitor corresponding to the full scale 2048LSB has a capacitance error that is smaller than the setting. In this case, as illustrated in FIG. 6(*a*), the integral nonlinearity has an inflection point at the point where the input voltage corresponds to 2048LSB. Similarly, in the diagram illustrating the relationship between input voltage and output data, an inflection point appears at the point where the input voltage corresponds to 2048LSB (FIG. 6(*b*)).

When several (e.g., three) offset binary voltages are input to an analog-to-digital converter 10 with such characteristics, as described above, the relationship between the input analog voltage and the output data is as illustrated in FIG. 6(C). That is, in FIG. 6(C), three offset binary voltages $V_A$, $V_B$, and $V_C$ offset at equal intervals are input to the analog-to-digital converter 10. When the voltage $V_B$ of the middle magnitude is set to the voltage corresponding to 2048LSB (the voltage corresponding to the inflection point), the output data corresponding to the voltages $V_A$, $V_C$ before and after this inflection point are in the same phase, and their differences A and C are the same value. That is, A=C. On the other hand, the output data corresponding to the voltage of the inflection point has the same phase as the output data before and after the inflection point, but its difference B is different in value from the differences A and C before and after the inflection point and is larger. That is, A=C<B.

Figure 7:
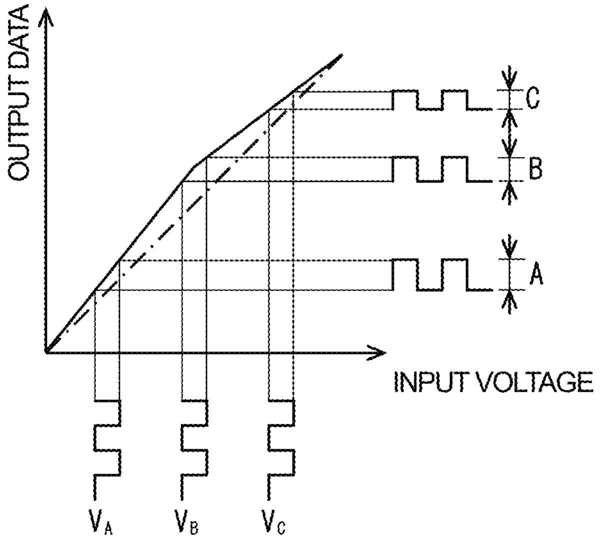
FIG. 7 is an explanatory diagram illustrating the weighting information generation process.
Figure 7:
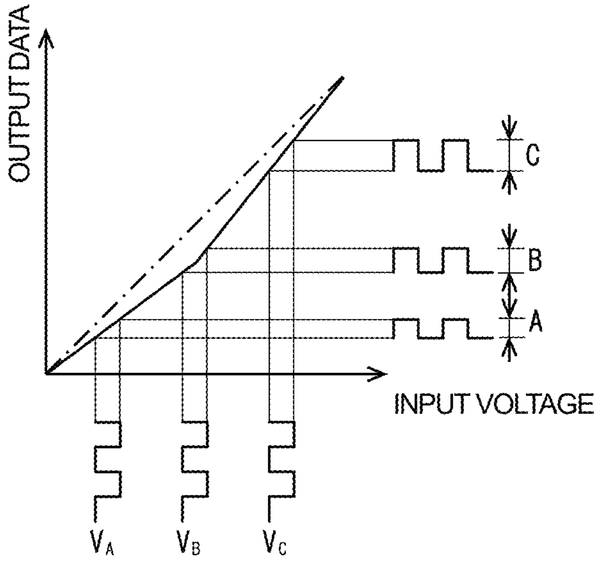

Further, in a case where the relationship between the input analog voltage and the output data has an inflection point at which the slope changes in the negative direction as the diagram illustrated in FIG. 7(*a*), for example, three offset binary voltages $V_A$, $V_B$, and $V_C$ offset at equal intervals are input to the analog-to-digital converter 10, and the voltage $V_B$ of the middle magnitude is set to the voltage corresponding to the inflection point. As a result, as illustrated in FIG. 7(*a*), the differences A, B, and C of the output data are gradually smaller. That is, A>B>C.

On the other hand, in a case where the relationship between the input analog voltage and the output data has an inflection point at which the slope changes in the positive direction, as the diagram illustrated in FIG. 7(*b*), for example, three offset binary voltages $V_A$, $V_B$, and $V_C$ offset at equal intervals are input to the analog-to-digital converter 10, and the voltage $V_B$ of the middle magnitude is set to the voltage corresponding to the inflection point. As a result, as illustrated in FIG. 7(*b*), the differences A, B, and C of the output data are gradually larger. That is, A<B<C.

In this manner, the slope change at the inflection point causes variation in the differences in the output data. Therefore, also in such a case, it is possible to determine the direction of weighting.

In the examples illustrated in FIGS. 5 to 7, the capacitance of the weighting adjustment unit 15 provided in the capacitors corresponding to 2048LSB is adjusted so that the signs of the difference values A, B, and C are the same, and the absolute values are equal. In other words, by selectively enabling each capacitor of the weighting adjustment unit 15 and adjusting its capacitance, the integral nonlinearity of the analog-to-digital converter 10 can be brought closer to the ideal straight line, that is, the integral nonlinearity can be improved.

Figure 8:
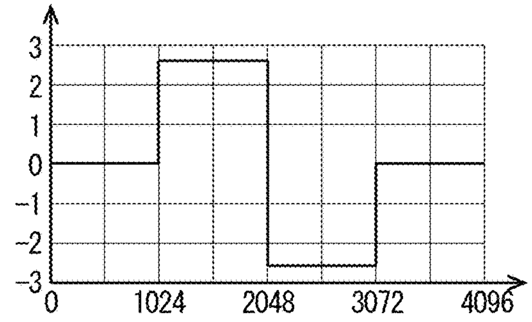
FIG. 8 is an explanatory diagram illustrating the weighting information generation process.
Figure 8:
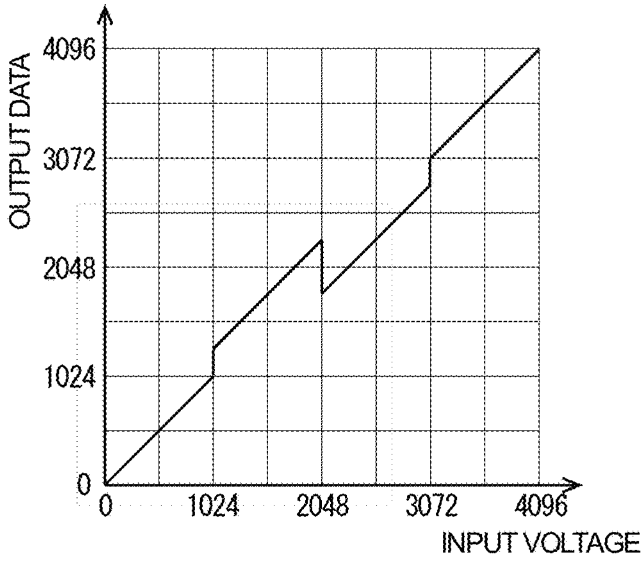
Figure 8:
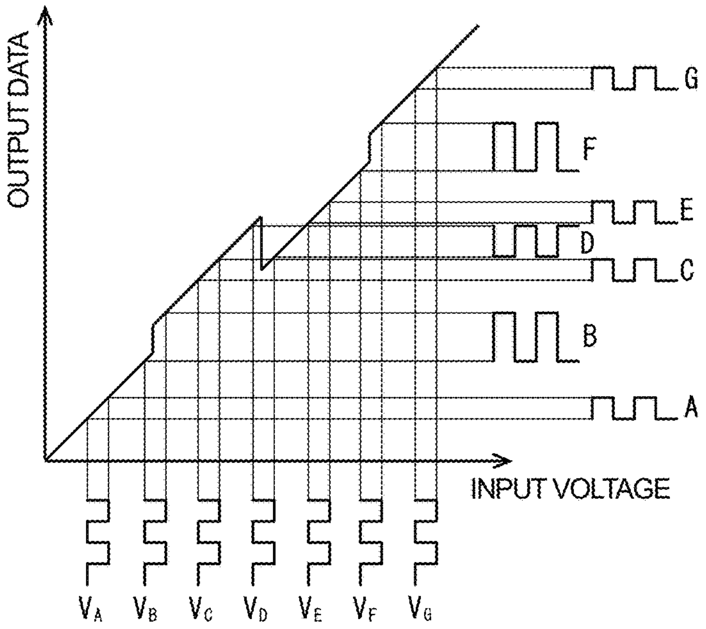

Further, as illustrated in FIG. 8(*a*), in a case where the integral nonlinearity draws a rectangular waveform with a plurality of sudden changes, the relationship between the input analog voltage and the output data is represented by a diagram as illustrated in FIG. 8(*b*). FIG. 8(*a*) illustrates the integral nonlinearity in a case where there are capacitance errors in the capacitors corresponding to 2048LSB (the full scale) and 1024LSB (half of the full scale). In this case, as illustrated in FIG. 8(*a*), the integral nonlinearity has inflection points at the points where the input voltage corresponds to 1024LSB and 2048LSB. Similarly, in the diagram illustrating the relationship between the input voltage and the output data, inflection points appear at the points where the input voltage corresponds to 1024LSB and 2048LSB (FIG. 8(*b*)).

When several (e.g., seven) offset binary voltages are input to an analog-to-digital converter 10 with such characteristics, as described above, the relationship between the input analog voltage and the output data is as illustrated in FIG. 8(C). That is, in FIG. 8(C), seven offset binary voltages offset at equal intervals are input to the analog-to-digital converter 10. Specifically, the voltages corresponding to ⅛ (=512), ¼ (=1024), ⅜ (=1536), ½ (=2048), ⅝ (=2560), ¾ (=3072), and ⅞ (=3584) of the full scale (=4096), i.e., $V_A$, $V_B$, $V_C$, $V_D$, $V_E$, $V_F$, and $V_G$ are input. Among these, the voltages $V_B$, $V_D$, and $V_F$ which correspond to ¼ (=1024), ½ (=2048), and ¾ (=3072) of the full scale respectively are the voltages corresponding to 1024LSB and 2048LSB (=MSB), which represent inflection points.

With respect to the specific input voltages, for example, in FIG. 8(*c*), assuming the full scale input voltage is 8[V] and the voltage range of the binary voltages is 0.1[V], the offset binary voltages $V_A$, $V_B$, $V_C$, $V_D$, $V_E$, $V_F$ and $V_G$ are as follows.

$$V_A = 1 \pm 0.05[\mathrm{V}],$$

$$V_B = 2 \pm 0.05[\mathrm{V}],$$

$$V_C = 3 \pm 0.05[\mathrm{V}],$$

$$V_D = 4 \pm 0.05[\mathrm{V}],$$

$$V_E = 5 \pm 0.05[\mathrm{V}],$$

$$V_F = 6 \pm 0.05[\mathrm{V}],$$

$$V_G = 7 \pm 0.05[\mathrm{V}].$$

As illustrated in FIG. 8(*c*), in this example, the output data corresponding to the input voltage $V_D$ is inverted in phase with the other output data. Where the differences in the output data corresponding to the input voltages $V_A$, $V_B$, $V_C$, $V_D$, $V_E$, $V_F$ and $V_G$ are represented by A, B, C, D, E, F, and G, respectively, these are in the following relationships. That is, $$A = C = E = G$$

$$A < B$$

$$E < F$$

In the example illustrated in FIG. 8, by adjusting the capacitance of the weighting adjustment unit 15 provided in the capacitors corresponding to 1024LSB and 2048LSB so that the signs of the difference values A, B, C, D, E, F, and G are the same, and their absolute values are equal, the integral nonlinearity of the analog-to-digital converter 10 can be brought closer to the ideal linearity, that is, the integral nonlinearity can be improved.

As described above, the integral nonlinearity can be verified by inputting offset voltages, which are binary voltages offset at a predetermined interval, to the target analog-to-digital converter 10 and evaluating its output data. In particular, it is preferred that the input offset voltages include voltages corresponding to ⅛, ¼, ⅜, ½, ⅝, ¾, and ⅞ of the full scale of the analog-to-digital converter 10. Further, it is preferable to include voltages corresponding to $2n-(\frac{1}{2})^m$ of the full scale. Here, m is the number of bits representing the resolution of the analog-to-digital converter 10.

Further, n is an integer satisfying the following $$n < 2^{m/2}$$

<Weighting Information Generating Unit>

According to the above considerations, the weighting information generating unit 20 of the present example generates information for adjusting the weighting adjustment unit 15 provided for each capacitor, in order to improve the integral nonlinearity of the analog-to-digital converter 10. That is, in this example, the unit generates information indicating which capacitors are to be enabled in each of the weighting adjustment units 15.

Specifically, as illustrated in FIG. 1, the weighting information generating unit 20 of the present example includes a control logic unit 21, an attenuator 22, a low pass filter unit 23, an adder 24, a switch Sw, a memory 25, and the like.

The control logic unit 21 generates an arbitrary binary voltage, that is, a pulse-shaped voltage forming a rectangular waveform, and also generates an offset signal for applying a voltage for offset to this reference binary voltage.

The accuracy of the generated binary voltage does not need to be precisely controlled, as long as the accuracy is sufficient to identify the inflection point. This binary voltage is generated from a logic signal of a TTL (Transistor-transistor logic) or a C-MOS (Complementary Metal Oxide Semiconductor) provided in the control logic unit 21. The amplitude level of the voltage is controlled by the attenuator 22 and is input to the adder 24. The control of the amplitude level by the attenuator 22 is performed by the control logic unit 21.

The offset signal is generated by a PWM (Pulse Width Modulation) circuit provided in the control logic unit 21, and by passing it through the low pass filter unit 23, it is added as an offset voltage to the binary voltage output from the attenuator 22. The thus-offset binary voltage (offset binary voltage) is input to the adder 24. One input terminal of the adder 24 is connected to an offset power supply having the same voltage as the input offset voltage of the analog-to-digital converter 10. By inputting the offset binary voltage to the other input terminal of the adder 24, the adder 24 outputs an analog voltage corresponding to the offset binary voltage, to which the input offset voltage of the analog-to-digital converter 10 has been added.

As described above, in the weighting information generating unit 20, under control by the control logic unit 21, binary voltages offset at predetermined intervals are generated, and the generated binary voltages are input to the target analog-to-digital converter 10. The input of the offset binary voltage to the analog-to-digital converter 10 can be performed by switching switch Sw to the adder 24 side, and the switching of switch Sw is controlled by the control logic unit 21. In this example, the control logic unit 21 and the attenuator 22 function as the voltage generation unit, the control logic unit 21 and the low pass filter unit 23 function as the voltage offset unit, and the control logic unit 21, the attenuator 22, the low pass filter unit 23, and the adder 24 function as the voltage input unit. Further, the control logic unit 21 functions as the information generating unit 21.

The binary voltages generated by the weighting information generating unit 20 should preferably include voltages corresponding to ⅛, ¼, ⅜, ½, ⅝, ¾, and ⅞ of the full scale of the analog-to-digital converter 10, as described above, and further, it is preferable to include voltages in the vicinity of those values, or voltages corresponding to $2n-(½)^m$ of the full scale. Note that m is the number of bits representing the resolution of the analog-to-digital conversion apparatus.

The control logic unit 21 inputs the above generated offset binary voltage to the analog-to-digital converter 10, acquires the output data output from the analog-to-digital converter 10, associates each offset binary voltages as the input value and the corresponding output data with each other, and stores them in the memory 25.

Then, the control logic unit 21 verifies (checks) value variation among the output data based on the acquired offset binary voltages and the output data, and performs a process to determine whether an inflection point exists in the integral nonlinearity, that is, to verify the linearity of the integral nonlinearity. If no inflection point exists, the current valid state of the weighting adjustment units of the adjustable capacitors is acquired as weighting information, and the information is stored in the memory 25.

On the other hand, when it is confirmed that an inflection point exists in the integral nonlinearity, the control logic unit 21 recognizes the offset binary voltage corresponding to the inflection point, and after recognizing the capacitor corresponding to the binary voltage, performs a process (adjustment process) to adjust the valid state of the capacitor of the corresponding weighting adjustment unit 15 for the analog-to-digital converter 10 based on the condition of the inflection point. As the adjustment process, the weighting adjustment unit 15 is adjusted so that the phases of each output value are the same and the difference values are equal. The adjustment of the weighting adjustment unit 15 can be performed theoretically or empirically by considering the variation among the output data.

After the adjustment process, the control logic unit 21 again generates the offset binary voltage and inputs the same to the analog-to-digital converter 10, acquires the output data output from the analog-to-digital converter 10, associates the input offset binary voltage and the output data with each other, and stores them in the memory 25, then checks the linearity of the integral nonlinearity, and if the linearity has been improved to fall within an acceptable range, store the valid state of the capacitors provided in the weighting adjustment units 15 in the memory 25 as weighting information.

On the other hand, if the linearity of the integral nonlinearity is not improved, the above adjustment process is repeatedly performed so as to improve the linearity of the integral nonlinearity to fall within the acceptable range, and the valid state of the capacitors in the weighting adjustment units 15 with the linearity improved are stored in the memory 25 as weighting information.

As described above, according to the analog-to-digital conversion apparatus 1 of the present example, the weighting information generating unit 20 inputs a predetermined offset binary voltage to the target analog-to-digital converter 10, and checks the linearity of the integral nonlinearity of analog-to-digital converter 10 based on the relationship between the output data output from the analog-to-digital converter 10 and the offset binary voltage as the input value. Further, if the linearity is not sufficient, the capacitance of the weighting adjustment unit 15 of the analog-to-digital converter 10 is adjusted so that the linearity falls within an acceptable range, and the adjusted weighting information is stored in the memory 25.

Thus, according to the analog-to-digital conversion apparatus 1 of the present example, the linearity of the integral nonlinearity of the target analog-to-digital converter 10 can be calibrated by the weighting information generating unit 20 so that its linearity falls within an acceptable range. After the calibration process, the analog-to-digital converter 10 may be separated from the analog-to-digital conversion apparatus 1 and distributed. Alternatively, by reassembling the target analog-to-digital converter 10 into the analog-to-digital conversion apparatus 1 of the present example, the analog-to-digital converter 10 can be recalibrated based on the weighting information stored in the memory 25.

According to the analog-to-digital conversion apparatus of the present example described in detail above, the integral nonlinearity of the analog-to-digital converter 10 can be verified by inexpensive devices such as the attenuator 22, the low pass filter unit 23, and the adder 24, and the integral nonlinearity of the analog-to-digital converter 10 can be improved. Therefore, compared to traditional approaches using high precision and expensive digital/analog converters, the verification of the integral nonlinearity of the analog-to-digital converter 10 can be achieved at a lower cost.

In this apparatus, the verification is performed on voltages in the vicinity corresponding to the capacitances of the capacitors in the analog-to-digital converter 10. Compared to traditional methods in which the voltage was precisely set for verification, the number of measurement points can be significantly reduced, thereby allowing the integral nonlinearity to be verified in a shorter time and more efficiently, and the integral nonlinearity can be improved.

Although specific embodiments of the present invention have been described above, the specific aspects that can be taken by the present invention are not limited in any way to the above-described exemplary aspects.

Figure 9:
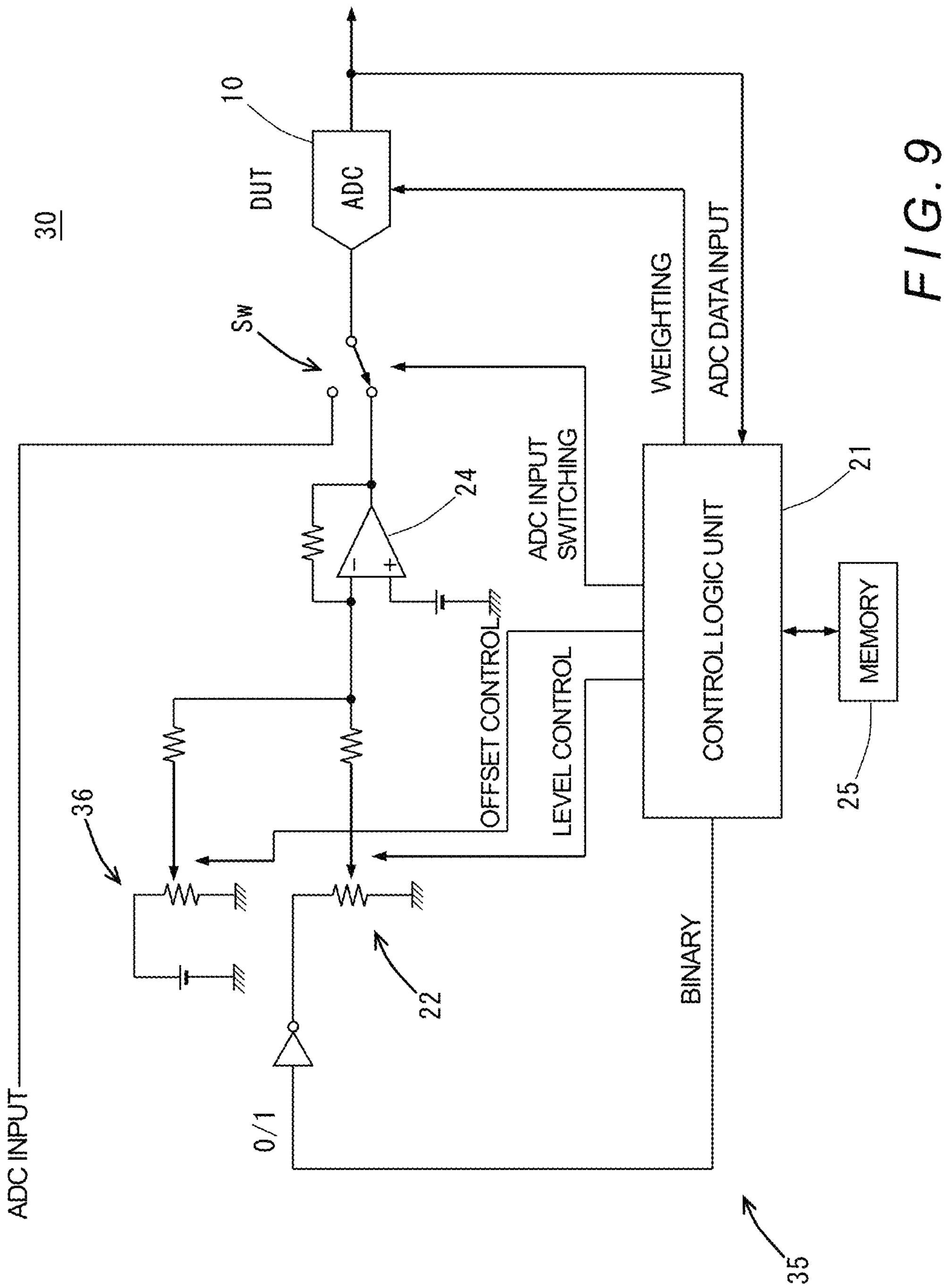
FIG. 9 is a circuit diagram illustrating an analog-to-digital conversion apparatus according to a variation.

For example, in the above example, a PWM circuit provided in the control logic unit 21 generates a binary signal, which is passed through the low pass filter unit 23 to generate an offset voltage, but the configuration for generating the offset binary voltage is not limited to such a configuration. An example is illustrated in FIG. 9. The analog-to-digital conversion apparatus 30 shown in FIG. 9 includes a weighting information generating unit 35 having an electronic volume 36 instead of the low pass filter unit 23 of the above example, and the weighting information generating unit 35 differs in this respect from the weighting information generating unit 20 of the above example in its configuration. In FIG. 9, components having the same configuration as those in the weighting information generating unit 20 are denoted by the same reference characters.

In the weighting information generating unit 35, the binary signal generated by the control logic unit 21 is controlled in its amplitude level by the attenuator 22, and an offset voltage generated by the electronic volume 36, which is controlled by the control logic unit 21, is added thereto, thereby generating an offset binary voltage. With such a configuration, it is possible to generate analog voltages for verification without using a high precision and expensive digital-to-analog converter as in the traditional approaches.

Figure 10:
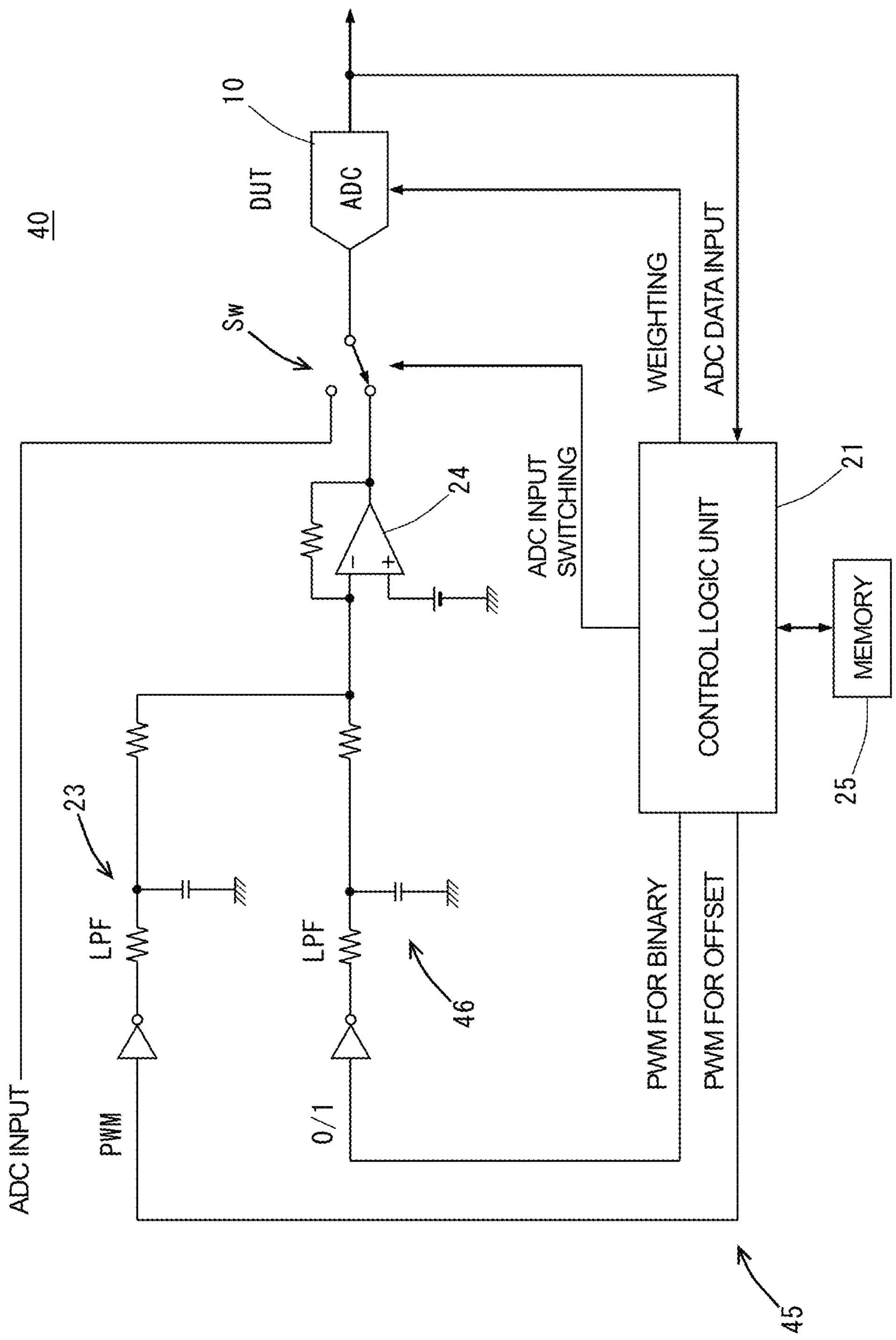
FIG. 10 is a circuit diagram illustrating the analog-to-digital conversion apparatus according to the variation.

The analog-to-digital conversion apparatus 40 shown in FIG. 10 further includes a weighting information generating unit 45 having a low pass filter unit 46 instead of the attenuator 22 in the above example, and the weighting information generating unit 45 differs in this respect from the weighting information generating unit 20 in the above example in its configuration. In FIG. 10, components having the same configuration as those in the weighting information generating unit 20 are denoted by the same reference characters.

In the weighting information generating unit 45, both the binary signal and the offset signal are generated by the PWM circuit provided in the control logic unit 21. The binary signal is level-adjusted by passing through the low pass filter unit 46 to become a binary voltage, and the offset signal is generated into an offset voltage by passing through low pass filter unit 23, which is input to the adder 24 as a combined offset binary voltage. Also with such a configuration, it is possible to generate analog voltages for verification without using a high precision and expensive digital-to-analog converter as in the traditional approaches.

Figure 11:
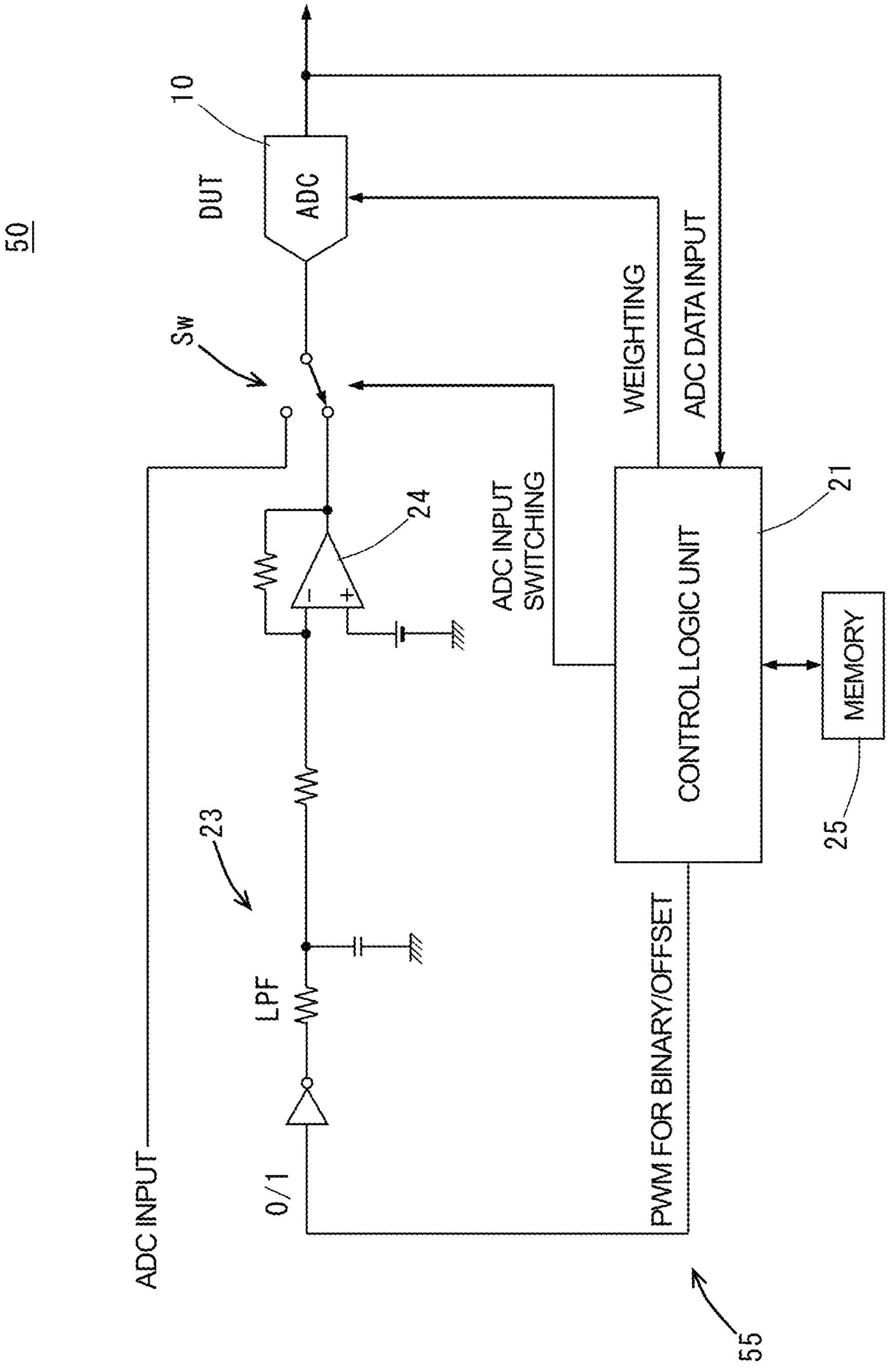
FIG. 11 is a circuit diagram illustrating the analog-to-digital conversion apparatus according to the variation.

Further, the analog-to-digital conversion apparatus 50 shown in FIG. 11 includes a weighting information generating unit 55 in which the attenuator 22 of the above-described example is omitted. The weighting information generating unit 55 is configured such that a binary signal and an offset signal, both generated by the PWM circuit within the control logic unit 21, are superimposed and input to the low pass filter unit 23. In FIG. 11, components having the same configuration as those in the weighting information generating unit 20 are also denoted by the same reference characters.

In the weighting information generating unit 55, a binary signal and an offset signal generated by the PWM circuit within the control logic unit 21 are superimposed and input to the low pass filter unit 23, which passes through the low pass filter unit 23 to become an offset binary voltage, which is then input to the adder 24. Also with such a configuration, it is possible to generate analog voltages for verification without using a high precision and expensive digital-to-analog converter as in the traditional approaches.

Figure 12:
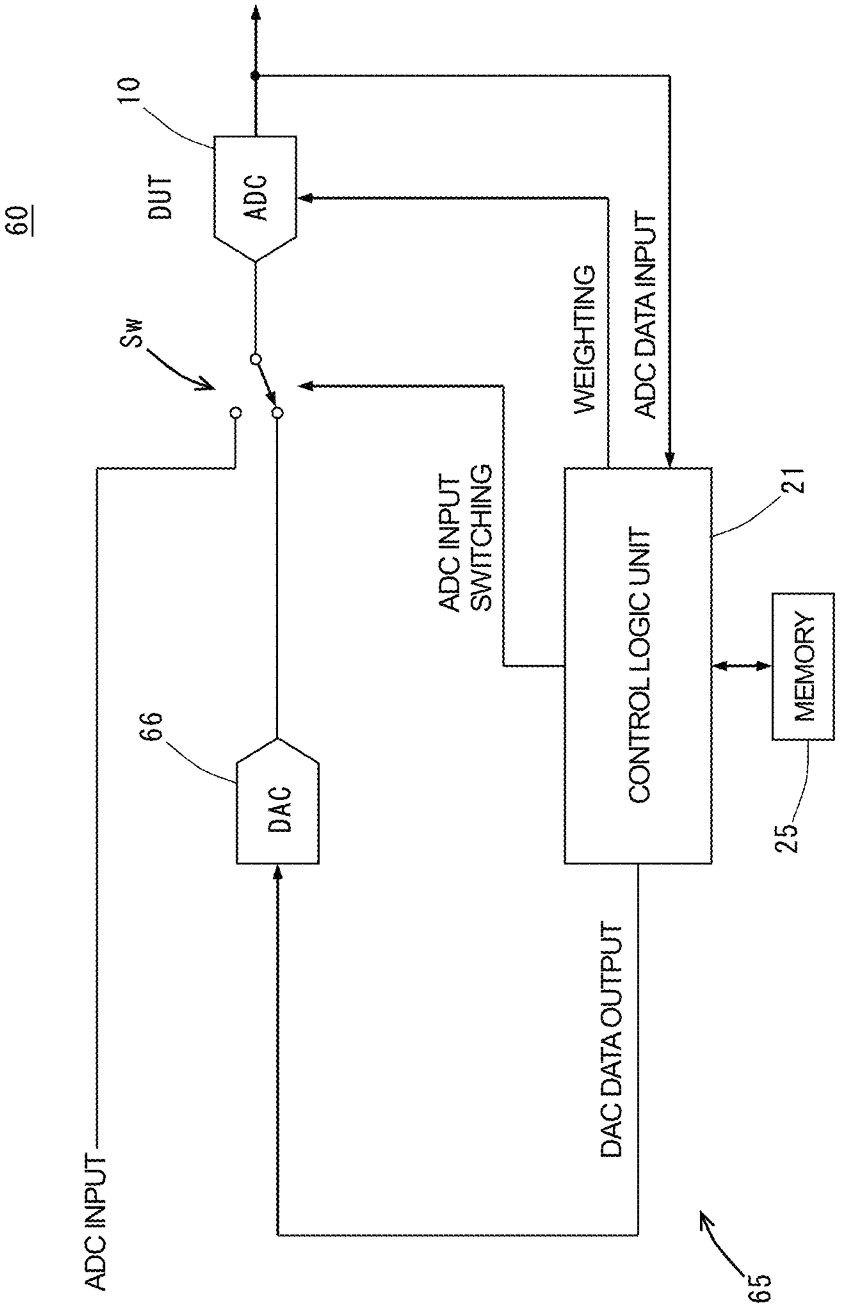
FIG. 12 is a circuit diagram illustrating the analog-to-digital conversion apparatus according to the variation.

The analog-to-digital conversion apparatus 60 shown in FIG. 12 includes a weighting information generating unit 65 having a digital-to-analog converter 66 with an inexpensive configuration instead of the attenuator 22, low pass filter unit 23, and adder 24 in the above example. In FIG. 12, components having the same configuration as those in the weighting information generating unit 20 are denoted by the same reference characters.

In the weighting information generating unit 65, a digital signal for the offset binary voltage is input from the control logic unit 21 to the digital-to-analog converter 66, and the analog voltage corresponding to the offset binary voltage, which is converted by the digital-to-analog converter 66, is input to the analog-to-digital converter 10. Also with such a configuration, it is possible to generate analog voltages for verification without using a high precision and expensive digital-to-analog converter as in the traditional approaches.

In the above example, a successive approximation type analog-to-digital converter is used as the analog-to-digital converter 10; however, the analog-to-digital converter 10 is not limited to this, and a parallel comparison type analog-to-digital converter may be used. In the above example, a capacitive type analog-to-digital converter is used as the analog-to-digital converter 10; however, the analog-to-digital converter 10 is not limited to this, and a resistive type analog-to-digital converter may be used.

Other Embodiments

In the above embodiment, when the integral nonlinearity obtained from the input and output data of the analog-to-digital converter 10 includes an inflection point, the integral nonlinearity (i.e., the capacitor capacitance) is corrected based on two input voltages provided to sandwich the input voltage corresponding to the inflection point, and the two output data corresponding thereto. For example, in the examples illustrated in FIGS. 5(A) to (C), the voltage VB corresponding to the inflection point of the integral nonlinearity were corrected based on the voltages VA, VC, and the output data corresponding to voltages VA, VC, respectively. In the present embodiment, it is assumed that the analog-to-digital converter 10 outputs ideal data (integral nonlinearity without inflection points) for the input voltages VA, VC. However, in practice, due to the structure of the analog-to-digital converter 10, the integral nonlinearity is output with a mixture of small and large inflection points.

Figure 13:
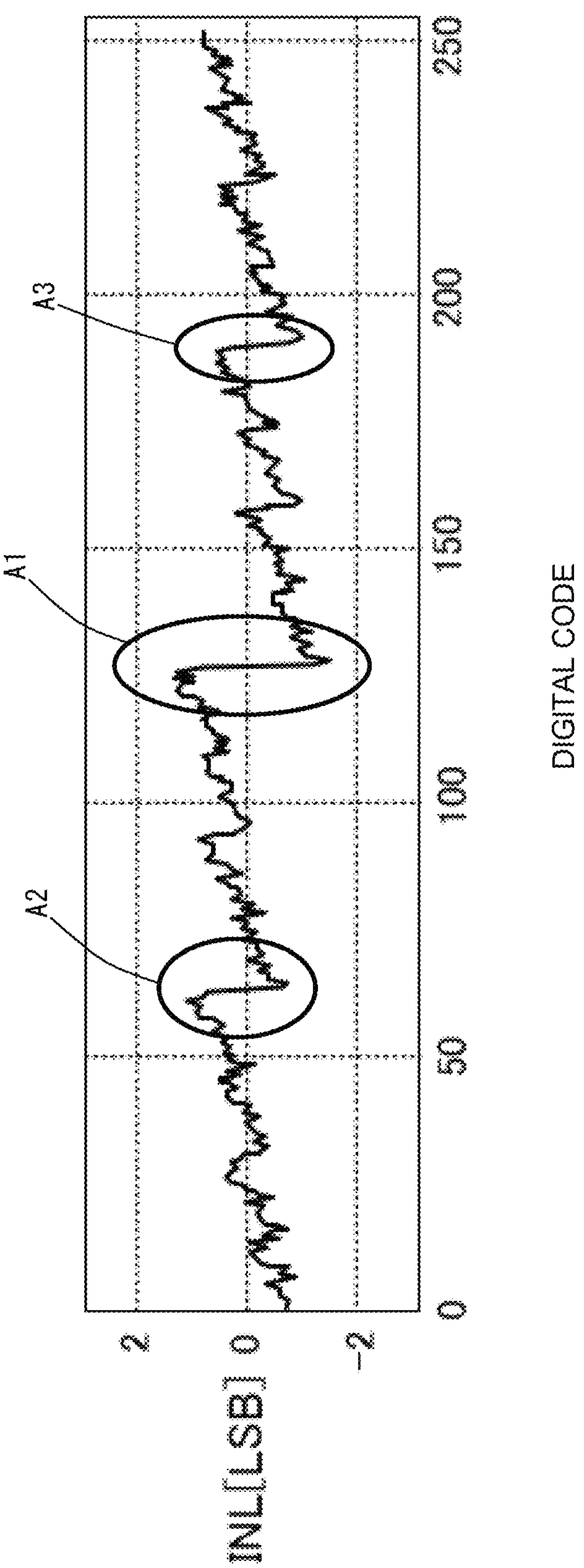
FIG. 13 is an example of an actual integral nonlinearity waveform.

FIG. 13 is an example of an actual integral nonlinearity waveform. The vertical axis shows the integral nonlinearity and the horizontal axis shows the digital code. Here, the integral nonlinearity of an 8-bit analog-to-digital converter is shown as an example. When the analog-to-digital converter 10 is ideal in output relative to input, the integral nonlinearity waveform is a horizontal straight line (integral nonlinearity is a constant value). However, in practice, due to various factors, the integral nonlinearity takes the form of a waveform with step differences (inflection points). The waveform includes step differences of various sizes. For example, small steps appear at digital code values around 32, 96, 160, and 224, and large step differences appear at digital code values around 64, 128, and 192. These step differences often appear mainly near digital code values that are powers of 2 and multiples thereof, due to the structure of analog-to-digital converters.

Suppose that the magnitude of a step difference A1, which appears at the position where the digital code value is 128, needs to be reduced. For example, suppose that the voltage of the capacitor is adjusted accordingly to reduce the magnitude of step difference A1 to zero. In this case, the magnitude of step difference A1 is reduced. However, if only the magnitude of the step difference A1 is reduced, it affects other parts of the integral nonlinearity waveform aside from the step difference A1 itself. For example, a step difference A2 at the position of digital code value 64 is lowered as a waveform while a step difference A3 at the position of digital code value 192 is lifted as a waveform. As a result, the range of integral nonlinearity values increases when viewed as a whole waveform.

Further, as in the above-described embodiment, when the integral nonlinearity corresponding to a potential between two points is corrected using the potential difference between the two points, the effectiveness of the correction is influenced by the selection of the two points. For example, suppose that when correcting the magnitude of the step difference A1 that appears at the position where the digital code value is 128, the digital code value 96 and 160 are selected as the two points for correction. If the integral nonlinearity waveform at the two points is linear, the step difference A1 is effectively corrected, as explained in the embodiment above. However, there are step differences at positions where the digital code values are 96 and 160. Therefore, the magnitude of step difference A1 is not always appropriately corrected by the correction method of the above embodiment. In this case, a process such as reselecting two points is required. As a countermeasure in such cases, the following processing method may be adopted.

Figure 14:
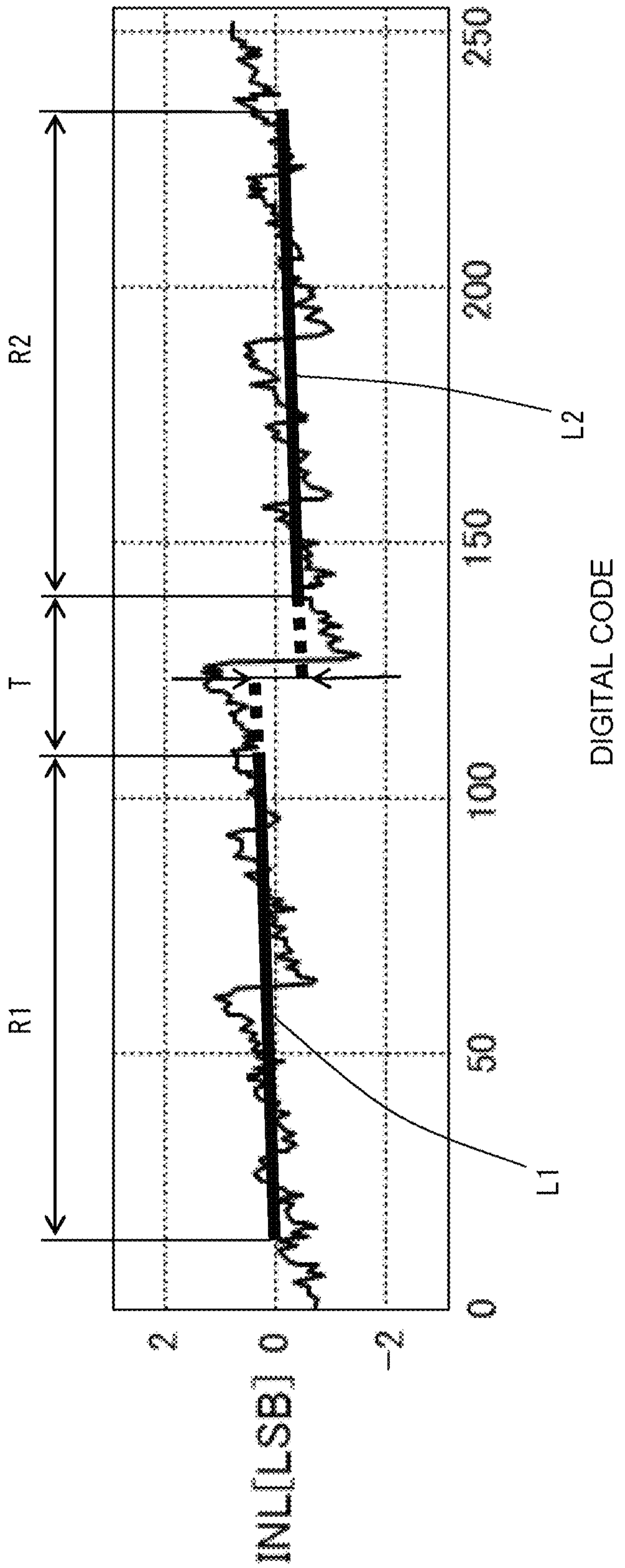
FIG. 14 is a diagram for explaining the details of another embodiment.

FIG. 14 is a diagram for explaining the details of another embodiment. The vertical axis shows the integral nonlinearity and the horizontal axis shows the digital code. The process to acquire the integral nonlinearity waveform in another embodiment is the same as in the embodiments described above. In another embodiment, the difference from the above embodiment lies in the correction of the step differences (integral nonlinearity errors) using two regression lines instead of the potential difference between two points. The configuration of the weighting information generating apparatus is also the same as in the above embodiment, so the explanation is omitted.

For the acquired integral nonlinearity waveform, the weighting information generating unit 20 sets a correction region T, a first regression region R1, which is different from the correction region T, and a second regression region R2, which is different from the correction region T and the first regression region R1. The weighting information generating unit 20 sets each region so that the correction region T is sandwiched between the first regression region R1 and the second regression region R2.

The correction region T may be set after the integral nonlinearity waveform is obtained or before the integral nonlinearity waveform is obtained. For example, the correction region T may be set by identifying the step differences from the acquired integral nonlinearity waveform. Step differences often appear at positions where the digital code value is a power of 2 and multiples thereof. The correction region T may be set in advance based on such prior information or empirical rules. The correction region T is set within a predetermined range of digital code values. In the present example, the correction region T is set in a predetermined digital code value range centered at the position where the digital code value is 128. The predetermined digital code value range is appropriately set within the range where the integral nonlinearity waveform is affected by step differences.

The first regression region R1 is set to be a different region from the correction region T. The first regression region R1 is set to a range of digital code values different from the correction region T. The first regression region R1 is set in a region where the digital code values are smaller than the correction region T. In this example, the maximum digital code value in the first regression region R1 coincides with the minimum digital code value in the correction region T. The minimum digital code value in the first regression region R1 is set accordingly. The minimum digital code value in the first regression region R1 may be set such that the first regression region R1 covers the entire range of digital code values smaller than the correction region T. The minimum digital code value in the first regression region R1 may be set such that the first regression region R1 covers a part of the range of digital code values smaller than the correction region T.

The second regression region R2 is set to be a different region from the first regression region R1 and the correction region T. The second regression region R2 is set to a range of digital code values different from the first regression region R1 and the correction region T. The second regression region R2 is set in a region where the digital code values are larger than the correction region T. In this example, the minimum digital code value in the second regression region R2 coincides with the maximum digital code value in the correction region T. The maximum digital code value in the second regression region R2 is set accordingly. The maximum digital code value in the second regression region R2 may be set such that the second regression region R2 covers the entire range of digital code values larger than the correction region T. The maximum digital code value in the second regression region R2 may be set such that the second regression region R2 covers a part of the range of digital code values greater than the correction region T.

The weighting information generating unit 20 calculates a first regression line L1 in the first regression region R1. The weighting information generating unit 20 calculates the first regression line L1 based on the digital code values and integral nonlinearity values in the first regression region R1. The calculation method is not particularly limited. The first regression line L1 is calculated, for example, by the least squares method. The first regression line L1 may be calculated using methods such as the maximum likelihood estimation method or the minimum absolute deviation method. In short, the weighting information generating unit 20 regressionally analyzes the acquired integral nonlinearity waveform and calculates the first regression line L1. The first regression line L1 may be a straight line or a curve. The first regression line L1 may be calculated by single regression analysis or by multiple regression analysis.

The weighting information generating unit 20 calculates a second regression line L2 in the second regression region R2. The weighting information generating unit 20 calculates the second regression line L2 based on the digital code values and integral nonlinearity values in the second regression region R2. The explanation of the second regression line L2 is omitted, as it is the same as that of the first regression line L1.

The weighting information generating unit 20 calculates the difference between the obtained first regression line L1 and second regression line L2. Specifically, the weighting information generating unit 20 virtually extends the first regression line L1 to the median digital code value within the correction region T. In this example, the median digital code value is 128. Similarly, the weighting information generating unit 20 virtually extends the second regression line L2 to the median digital code value within the correction region T. The weighting information generating unit 20 calculates the difference between the integral nonlinearity value on the first regression line L1 and the integral nonlinearity value on the second regression line L2 at the position of the median digital code value within the correction region T.

The weighting information generating unit 20 generates weighting information based on the difference between the calculated first regression line L1 and the second regression line L2. The weighting information generating unit 20 generates weighting information to reduce the calculated difference, for example. As in the above embodiment, the capacitance of the weighting adjustment unit 15 in each capacitor is adjusted based on the weighting information, and the integral nonlinearity of the analog-to-digital converter 10 is corrected. The method of reducing the difference is not particularly limited. The method for reducing the difference includes, for example, a search using the bisection method. Further, the extent to which the difference is reduced is determined by the accuracy of the capacitor capacitance correction. For example, when using the bisection method, the process is terminated when there is no change in the value of the difference (diff) even after changing the correction value of the capacitor capacitance.

Figure 15:
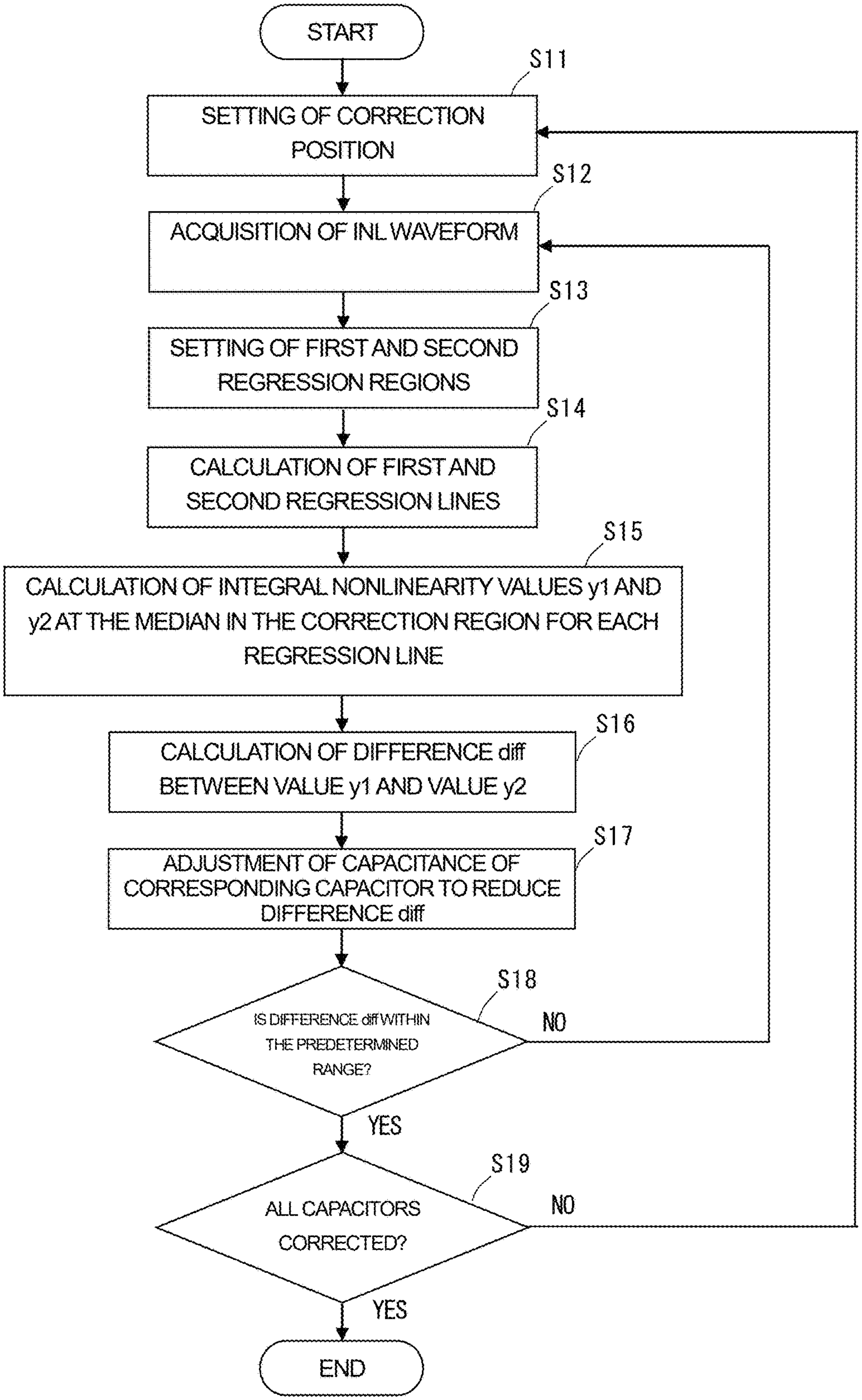
FIG. 15 is a flowchart of the correction process for integral nonlinearity in another embodiment.

FIG. 15 is a flowchart of the correction process for integral nonlinearity in another embodiment. In the figure, the flow until the integral nonlinearity waveform is obtained is omitted. First, the weighting information generating unit 20 sets digital code values to be corrected in the obtained integral nonlinearity waveform (Step S11). The weighting information generating unit 20 sets the correction region T described above with the digital code value set as the median. In other words, this flowchart shows the case where the correction region T is set in advance.

Next, the weighting information generating unit 20 acquires output data necessary for determining the integral nonlinearity from the analog-to-digital converter 10. The weighting information generating unit 20 calculates integral nonlinearity waveform (data group) from the acquired output data (Step S12).

Next, the weighting information generating unit 20 sets the first regression region R1 and the second regression region R2 from the acquired integral nonlinearity waveform (Step S13).

The weighting information generating unit 20 then calculates a first regression line L1 in the first regression region R1. The weighting information generating unit 20 calculates a second regression line L2 in the second regression region R2 (Step S14). In this example, the first regression line L1 and the second regression line L2 are single regression lines.

Next, the weighting information generating unit 20 expresses the first regression line L1 as an equation "y1=ax1+b". Note that y1 is the integral nonlinearity, x1 is the digital code value, a is a coefficient, and b is a constant. The weighting information generating unit 20 calculates the value of y1 at x1=2^n in the equation. Similarly, the weighting information generating unit 20 expresses the second regression line L2 as an equation "y2=ax2+b". Note that y2 is the integral nonlinearity, x2 is the digital code value, a is a coefficient, and b is a constant. The weighting information generating unit 20 calculates the value of y2 at x2=2^n in the equation (Step S15).

Next, the weighting information generating unit 20 calculates the difference "diff=y2−y1" between the calculated y1 value and y2 value (Step S16).

Next, the weighting information generating unit 20 adjusts the capacitor (weighting adjustment unit 15) of the analog-to-digital converter 10 corresponding to the median digital code value (2^n) to reduce the calculated difference diff (Step S17).

Next, the weighting information generating unit 20 verifies the integral nonlinearity of the analog-to-digital converter 10 after the capacitor capacitance is adjusted (Step S18). Specifically, in step S18, the weighting information generating unit 20 performs steps S12 to S16 and verifies whether the value of the difference diff falls within a predetermined range (has been reduced). If the weighting information generating unit 20 determines that the value of the difference diff is outside the predetermined range (NO in step S18), the process returns to step S12. The weighting information generating unit 20, when determining that the value of the difference diff falls within the predetermined range (YES in step S18), verifies whether the capacitance of all capacitors in the analog-to-digital converter 10 has been adjusted (step S19).

If the weighting information generating unit 20 has not completed the adjustment of all capacitor capacitances (NO in step S19), the process returns to step S11. In this case, the weighting information generating unit 20 changes the median digital code value (2^n) in the correction region T and performs steps S12 to S18. When the weighting information generating unit 20 has adjusted all the capacitor capacitances (YES in step S19), the correction process is completed.

As explained above, in the weighting information generating apparatus according to another embodiment, even if the step difference A1 (the value of integral nonlinearity in the correction region T) to be corrected is corrected during the correction process, its influence on the waveform in regions other than the correction region T is minimal. Additionally, in the weighting information generating apparatus according to another embodiment, even if step differences (integral nonlinearity errors) exist in regions other than the correction region T, they are absorbed by the first and second regression lines. In other words, the correction process can be performed by suppressing the influence of step differences in regions other than the correction region T. Additionally, in the weighting information generating apparatus according to another embodiment, not only the digital code value to be corrected, but also a predetermined range including the digital code value is set as the correction region T. Therefore, for example, even if a step difference does not exist precisely at a position corresponding to a power of 2 in digital code values, appropriate correction can still be performed as long as the step difference is included within the correction region T. Thus, according to the weighting information generating apparatus according to another embodiment, the correction process can be performed appropriately even if the integral nonlinearity waveform includes step differences (errors) of various magnitudes. That is, according to the weighting information generating apparatus of another embodiment, the robustness in the correction process is improved.

Again, note that the above description of embodiments is in all respects illustrative and not restrictive. Variations and modifications are possible for those skilled in the art. The scope of the present disclosure is indicated by the claims, not by the embodiments described above. Further, the scope of the present invention includes modifications of the embodiments that fall within the scope of the patent claims and the equivalents.

LISTING OF REFERENCE CHARACTERS

1 Analog-to-Digital Conversion Apparatus
10 Analog-to-Digital Converter
11 Comparator
12 Capacitor Array
13 Switch Control Register
14 Successive Approximation Logic Circuit
15 Weighting Adjustment Unit
20 Weighting Information Generating Unit
21 Control Logic Unit
22 Attenuator
23 Low Pass Filter Unit
24 Adder
25 Memory

The invention claimed is:

1. A weighting information generating apparatus configured to generate weighting information to be applied to a weighting adjustment unit of an analog-to-digital converter provided with the weighting adjustment unit, comprising:

a voltage input unit having: a voltage generation unit that generates a predetermined binary voltage; and a voltage offset unit that offsets the binary voltage generated by the voltage generation unit by applying a voltage for offset, and being configured to generate a plurality of binary voltages as offset voltages offset stepwise for each predetermined voltage and sequentially input the same to the analog-to-digital converter; and an information generating unit that acquires output values corresponding to the plurality of binary voltages output from the analog-to-digital converter, and generates the weighting information based on the acquired output values.

2. The weighting information generating apparatus of claim 1, wherein the information generating unit is configured to generate weighting information such that the output values output from the analog-to-digital converter exhibit the same phase and fall within a predetermined reference range.

3. The weighting information generating apparatus of claim 1, wherein the voltage input unit is configured to generate a plurality of binary voltages as offset voltages such that at least one of the plurality of binary voltages has voltages corresponding to ⅛, ¼, ⅜, ½, ⅝, ¾, and ⅞ of the full scale of the analog-to-digital converter, and to input the same to the analog-to-digital converter.

4. The weighting information generating apparatus of claim 3, wherein the voltage input unit is configured to generate a plurality of binary voltages as offset voltages such that at least one of the binary voltages has a voltage corresponding to $2n-(1/2)^m$ of the full scale of the analog-to-digital converter, and to input the same to the analog-to-digital converter, where, m is the number of bits representing the resolution of the analog-to-digital converter; and n is an integer satisfying the following:

$$n<2^{m/2}.$$

5. The weighting information generating apparatus of claim 1, wherein:

the voltage input unit is configured to sequentially input voltages that are offset by the same offset interval to the analog-to-digital converter; and the information generating unit is configured to: acquire output values corresponding to the voltages output from the analog-to-digital converter; compare an acquired output value with other output values; when a difference value exceeds a predetermined reference range or when the sign of the difference value is reversed, store the corresponding input voltage; adjust the weighting adjustment unit of the analog-to-digital converter, while the stored input voltage is input from the voltage input unit to the analog-to-digital converter, such that the difference between the output value and the other output values falls within the reference range and the signs are the same; and generate the state of the weighting adjustment unit at that time, as weighting information.

6. The weighting information generating apparatus of claim 1, wherein the information generating unit is configured to: acquire output values corresponding to the voltages output from the analog-to-digital converter; set the output values in a predetermined voltage range as correction target output values; calculate a first regression line based on the output values in a voltage range lower than the predetermined voltage range; calculate a second regression line based on the output values in a voltage range higher than the predetermined voltage range; and generate the weighting information based on the first regression line and the second regression line.

7. An analog-to-digital converter comprising a weighting adjustment unit, wherein the weighting adjustment unit is configured to adjust the analog-to-digital converter such that output values output from the analog-to-digital converter exhibit the same phase and fall within a predetermined reference range, based on output values corresponding to offset voltages output from the analog-to-digital converter, the offset values being generated by applying a voltage for offset to binary voltages, the offset voltages being offset stepwise offset for each predetermined voltage and sequentially input to the analog-to-digital converter.

* * * * *